(12) United States Patent
Zumoto et al.

(10) Patent No.: US 7,777,605 B2
(45) Date of Patent: Aug. 17, 2010

(54) INDUCTION COUPLING APPARATUS

(75) Inventors: Nobuyuki Zumoto, Tokyo (JP); Hiroshi Isoya, Tokyo (JP); Takao Tsurimoto, Tokyo (JP); Yuichiro Murata, Tokyo (JP); Youichi Hisamori, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 645 days.

(21) Appl. No.: 11/723,104

(22) Filed: Mar. 16, 2007

(65) Prior Publication Data

US 2007/0285201 A1   Dec. 13, 2007

(30) Foreign Application Priority Data

Apr. 13, 2006   (JP) .............................. 2006-110987

(51) Int. Cl.
*H01F 17/06* (2006.01)
(52) U.S. Cl. .................. 336/178; 324/126; 324/127
(58) Field of Classification Search .................. 336/178
See application file for complete search history.

(56) References Cited

U.S. PATENT DOCUMENTS 1,889,361 A * 11/1932 Hickok .................. 324/140 R
5,426,360 A * 6/1995 Maraio et al. ............... 324/126
2003/0222748 A1   12/2003 Cern et al.

* cited by examiner

*Primary Examiner*—Elvin G Enad
*Assistant Examiner*—Joselito Baisa
(74) *Attorney, Agent, or Firm*—Buchanan Ingersoll & Rooney PC

(57) ABSTRACT

To provide a structure capable of securing satisfactory induction coupling efficiency and high reliability in manufacturing an induction coupling apparatus used in power line carrier communication, the induction coupling apparatus having a magnetic core formed from a first core element part and a second core element part so that a gap would be formed between the core element parts, includes: a core parallel moving mechanism for carrying out relative and parallel movement of the first core element part and the second core element part in a direction that the length of the gap varies; and a predetermined gap length regulating member for limiting parallel movement in a direction that the first core element part and the second core element part approach each other to regulate the gap length to the predetermined gap length in the case that the core parallel moving mechanism is used for the parallel movement.

19 Claims, 7 Drawing Sheets

INDUCTION COUPLING APPARATUS

BACKGROUND OF THE INVENTION

1. Field of the Invention

The present invention relates to a structure of an induction coupling apparatus used in power line carrier communication.

2. Description of the Related Art

An induction coupling apparatus is an apparatus for superposing a data signal on a power line by electromagnetic induction. Using a magnetic core surrounding a power line and an exciting coil surrounding the magnetic gore to apply signal electric current to the exciting coil generates the electromagnetic induction. The magnetic core is arranged to be able to be divided into two. A mechanism capable of separating and uniting the magnetic core having such a structure is used for mounting the magnetic core to the power line.

In a conventional induction coupling apparatus, one side of the respective divided parts of the magnetic core having a structure divided into two is connected by means of a hinge while the other side is opened and closed, so that the magnetic core is mounted to the power line so as to surround the power line. An upper side core of the magnetic core divided into two is provided with a lifting grip and a bolt for opening and closing the core. A lower side core is provided with a bolt for fixing the upper side core (See Patent Reference 1, for example).

Patent Reference 1: JP-A-2005-525021 (FIGS. 3 and 6 and description thereof)

The conventional induction coupling apparatus disclosed in Patent Reference 1 or such, which is formed as described above, has a structure that the induction coupling apparatus can slide to move in the longitudinal direction of the power line. In the case that the induction coupling apparatus moves from a predetermined position of the power line to another position along the power line due to a blast of wind or such, a malfunction such as a defect in connection or cutting of a signal line occurs in some cases due to force added to the signal line connected to the induction coupling apparatus. Further, in the case that an ordinary wind, which is comparatively strong, blows, a respiration phenomenon of the wind that the strength of the wind varies causes repeated collision between the power line and the magnetic core whenever the strength of the wind changes since the induction coupling apparatus is arranged to slide to move in the longitudinal direction of the power line, that is, since a gap allowing the movement is formed between the power line and the magnetic core. Oscillation due to the repeated collision causes an undesirable variation in induction coupling efficiency. Moreover, the repeated collision causes damage to the power line and the magnetic core in a long term, so that the reliability is likely to decline.

In addition, the upper and lower side magnetic cores are connected with each other by means of a hinge. Such a structure may cause a difference in space between the respective magnetic cores on the upper and lower sides according to tolerance of the hinge part. Accordingly, the hinge part manufactured at a low cost with poor accuracy causes deterioration in accuracy of a space of a gap, and thereby, deterioration in induction coupling efficiency. In the case that the hinge part is manufactured with high accuracy, however, there is no problem in induction coupling efficiency but a problem that the manufacturing cost becomes high is caused.

Furthermore, angles of the grip, the opening and closing bolt and a fixing bolt are uneven. This causes a structure that the angle for connecting the lifting grip used for mounting the apparatus to the power line is uneven. Accordingly, troublesome operations are required such that the grip of the apparatus is held from the upper part by means of a handle in putting the core on the power line, the opening and closing bolt is operated from the lower part in opening and closing the core and the fixing bolt different from the opening and closing bolt is operated at another angle in fixing the core.

Therefore, in manufacturing an induction coupling apparatus used in power line carrier communication, required are research and development of a structure capable of securing satisfactory induction coupling efficiency and high reliability.

SUMMARY OF THE INVENTION

In view of the above, an object of the invention is to secure satisfactory induction coupling efficiency and high reliability.

The invention is an induction coupling apparatus used in a system for performing signal transmission with a power line used as a medium for transmitting a signal, the induction coupling apparatus for electro-magnetically coupling a signal line used as the medium for transmitting a signal to the power line and the power line through a magnetic core, wherein the magnetic core is formed from a first core element part and a second core element part so that a gap would be formed between the core element parts, the induction coupling apparatus comprising: a core parallel moving mechanism for carrying out relative and parallel movement of the first core element part and the second core element part in a direction that the length of the gap varies; and a predetermined gap length regulating member for limiting parallel movement in a direction that the first core element part and the second core element part approach each other to regulate the gap length to the predetermined gap length in the case that the core parallel moving mechanism is used for the parallel movement. Accordingly, the length of the gap can be easily and certainly made a predetermined length of the gap. This allows the satisfactory induction coupling efficiency and high reliability to be secured.

Further, the invention is an induction coupling apparatus used in a system for performing signal transmission with a power line used as a medium for transmitting a signal, the induction coupling apparatus for electro-magnetically coupling a signal line used as the medium for transmitting a signal to the power line and the power line through a magnetic core, comprising a clamp mechanism mounted to a main body part of the induction coupling apparatus for holding the power line on the both sides of the magnetic core in a direction of extension of the power line, wherein the clamp mechanism holds the power line to determine the relative positions of the magnetic core and the power line. Accordingly, the main body of the induction coupling apparatus is certainly mounted to the power line via the clump mechanism, so that the relative positions of the magnetic core and the power line are difficult to change due to a wind or such. This allows the satisfactory induction coupling efficiency and high reliability to be secured.

The foregoing and other objects, features, aspects and advantages of the present invention will become more apparent from the following detailed description of the present invention when taken in conjunction with the accompanying drawings.

DETAILED DESCRIPTION OF THE INVENTION

Embodiment 1

Figure 1:
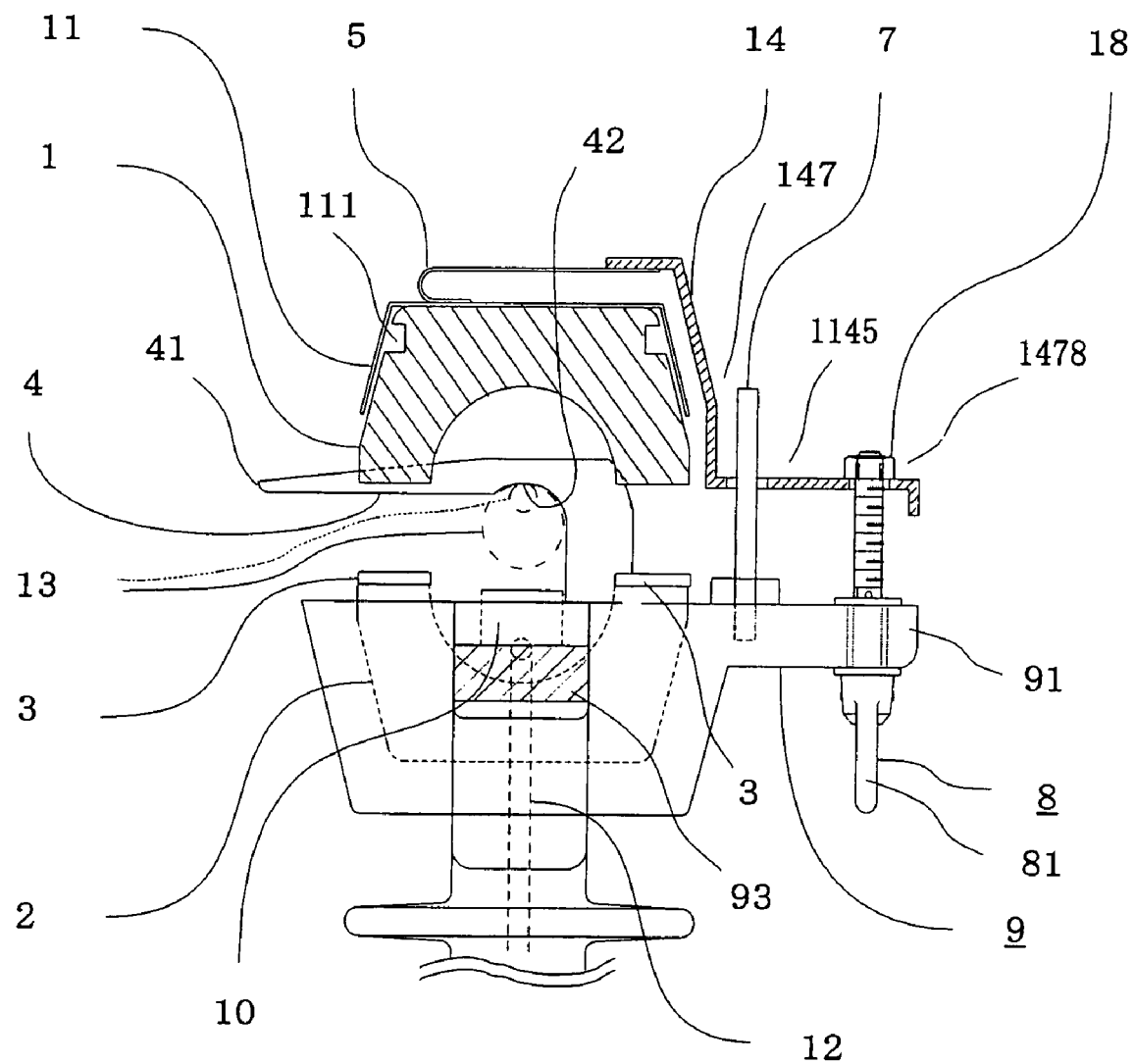
FIG. 1 is a vertically left side view of an example of an induction coupling apparatus in accordance with Embodiment 1 of the invention with a partially sectional view in a direction of an arrow along a line I-I in FIG. 2, showing a state that a first core element part is most separated from a second core element part by means of a core parallel moving mechanism.
Figure 2:
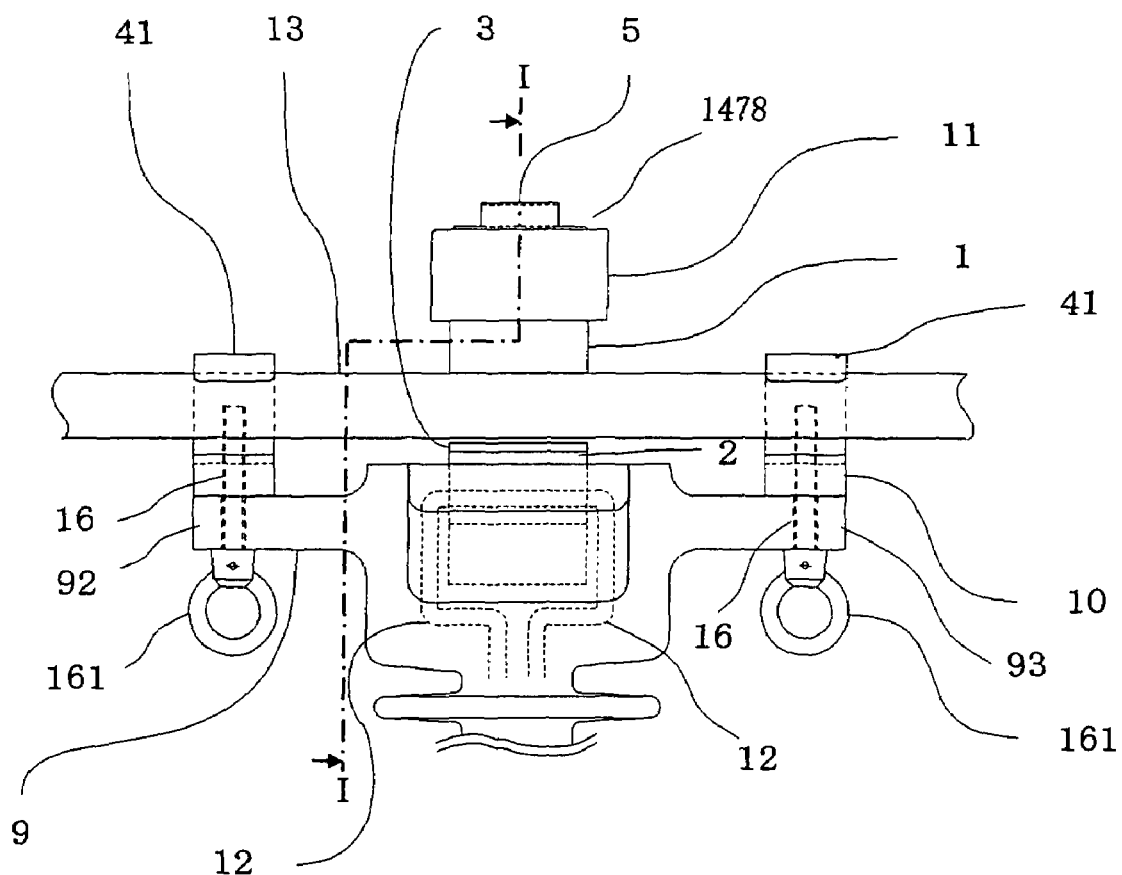
FIG. 2 is a front view of a whole structure of an induction coupling apparatus in accordance with Embodiment 1 of the invention, the view from the left side of FIG. 1.
Figure 3:
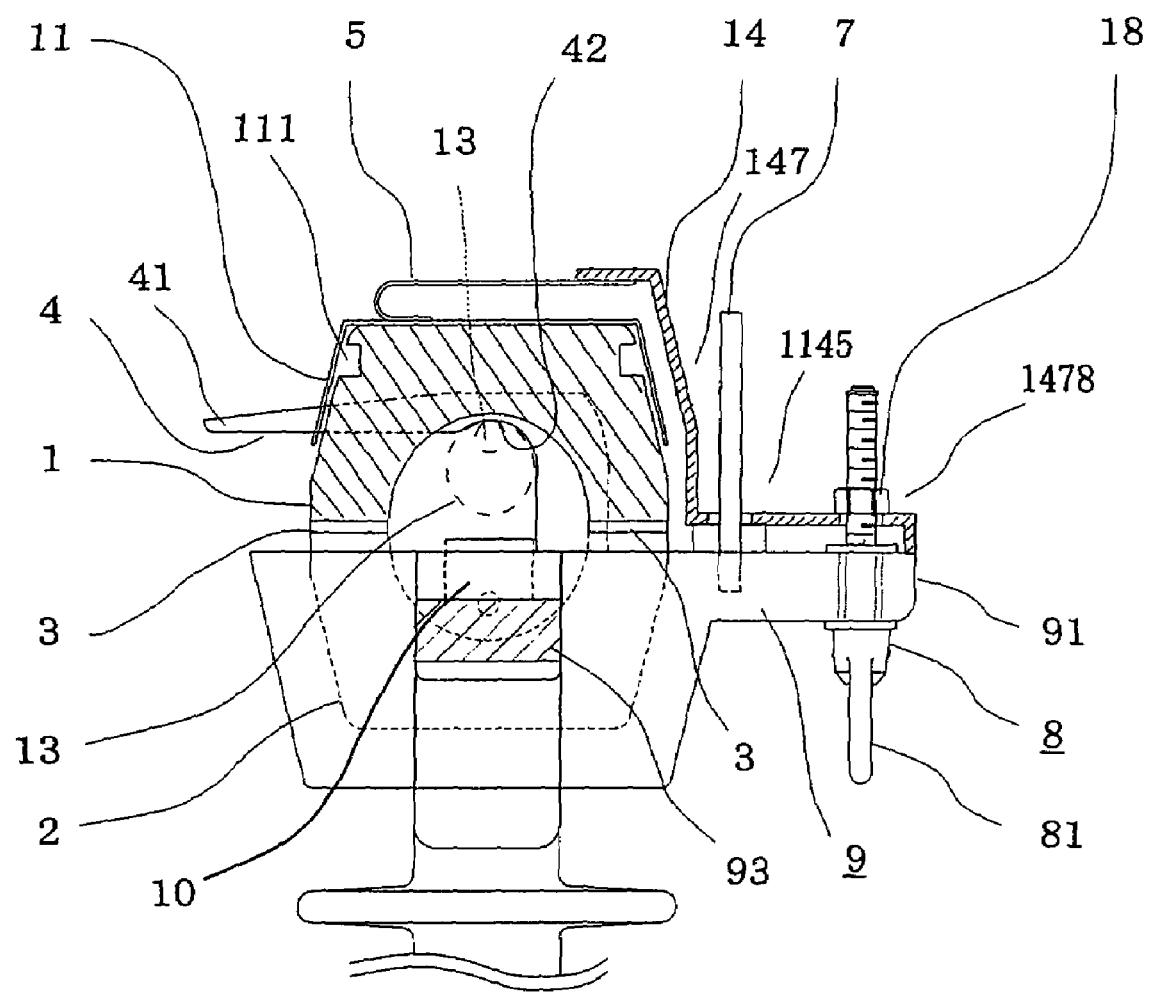
FIG. 3 is a vertically left side view corresponding to FIG. 1 of an induction coupling apparatus in accordance with Embodiment 1 of the invention, the induction coupling apparatus having a first core element part and a second core element part put close to each other by means of a core parallel moving mechanism so that the length of a gap would be a predetermined gap length.
Figure 4:
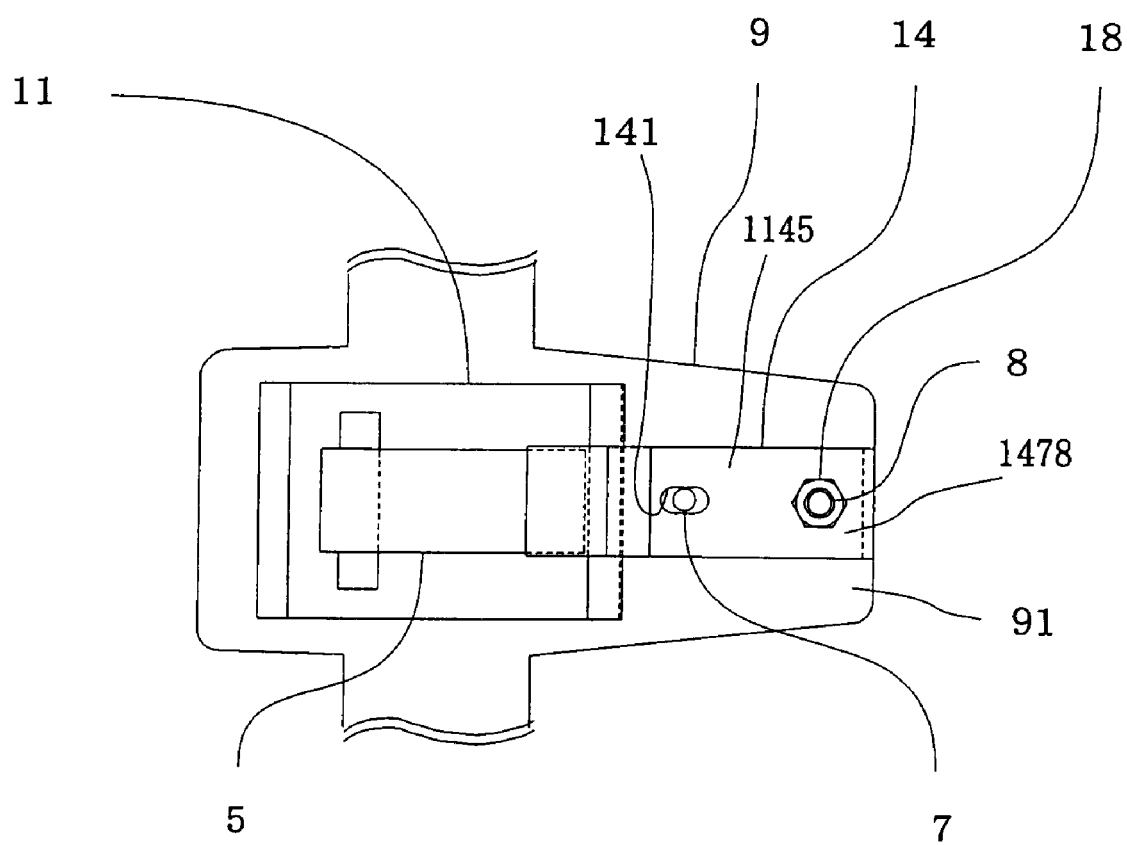
FIG. 4 is a schematically plan view of a clamp mechanism in accordance with Embodiment 1 of the invention.
Figure 5:
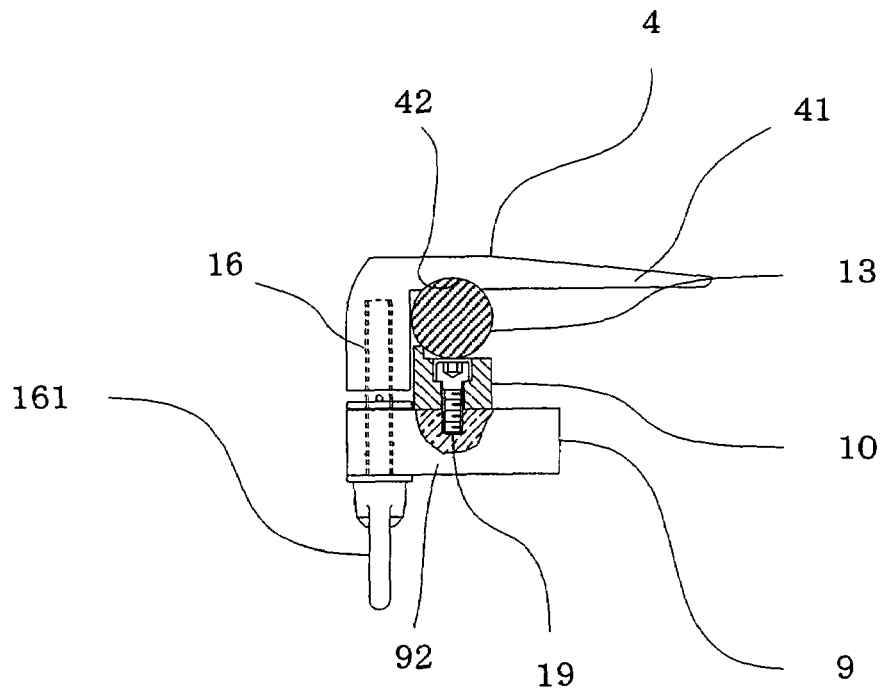
FIG. 5 is a right side view of the periphery of a clamp mechanism in accordance with Embodiment 1 of the invention.

Embodiment 1 of the invention will be described hereinafter with reference to FIGS. 1 to 5. FIG. 1 is a vertically left side view of an example of an induction coupling apparatus in accordance with Embodiment 1 of the invention with a partially sectional view in a direction of an arrow along a line I-I in FIG. 2, showing a state that a first core element part is most separated from a second core element part by means of a core parallel moving mechanism. FIG. 2 is a front view of a whole structure of an induction coupling apparatus in accordance with Embodiment 1 of the invention, the view from the left side of FIG. 1. FIG. 3 is a vertically left side view corresponding to FIG. 1 of an induction coupling apparatus in accordance with Embodiment 1 of the invention, the induction coupling apparatus having a first core element part and a second core element part put close to each other by means of a core parallel moving mechanism so that the length of a gap would be a predetermined gap length. FIG. 4 is a schematically plan view of a clamp mechanism in accordance with Embodiment 1 of the invention. FIG. 5 is a right side view of the periphery of a clamp mechanism in accordance with Embodiment 1 of the invention. Same signs and numerals denote same components in the drawings.

As shown in FIGS. 1 to 5, an induction coupling apparatus in accordance with Embodiment 1 of the invention comprises an upper side first core element part (simply referred to as "an upper core", hereinafter) 1, a lower side second core element part (simply referred to as "a lower core", hereinafter) 2, a predetermined gap length regulating member 3, a clamp mechanism 4, an elastic member (referred to as "an upper core fixing spring", hereinafter) 5, a positioning pin 7, a bolt (referred to as "a core driving bolt", hereinafter) 8, an induction coupling apparatus main body part 9, a positioning member (referred to as "a power line fixing tool", hereinafter) 10, a core case 11, a primary winding 12, a holding plate 14, a nut 18 and a bolt 19. The induction coupling apparatus is mounted to a power line 13 used as a communication medium.

As clearly shown in FIG. 1, the upper core 1 on the upper side is fixed to the core case 11 while the lower core 2 on the lower side is molded into one body with the induction coupling apparatus main body 9 in molding the induction coupling apparatus main body 9, whereby the latter constitutes a holder for the core 2. The primary winding 12, which is a part of a signal line, is wound around the lower core 2.

The upper core fixing spring 5 is fixed at one end thereof to the core case 11. The upper core fixing spring 5 is further fixed to one end of the holding plate 14.

The holding plate 14 is formed from a sheet of plate substantially formed into the shape of L as shown in FIG. 1. On the other end of the holding plate 14, fixed is the nut 18 into which the core driving bolt 8 is screwed. Moreover, the positioning pin 7 provided in the induction coupling apparatus main body 9 is inserted into a schematically long hole 141 drilled in the middle part of the holding plate 14.

The core case 11, the upper core fixing spring 5 and the holding plate 14 form a core holding mechanism part 1145 for holding the upper core 1.

The holding plate 14, which has the schematically long hole 141, and the positioning pin 7 form a positioning mechanism 147 for preventing the core holding mechanism part 1145 from rotating about the bolt in accordance with rotation of the core driving bolt 8 to hold the core holding mechanism part 1145 at a predetermined position.

The core holding mechanism part 1145, the positioning mechanism 147, the nut 18 and the core driving bolt 8 form a core parallel moving mechanism 1478 for moving the upper core 1 parallel to the lower core (in a vertical direction in the case shown in the drawings).

The predetermined gap length regulating members 3 are provided between a pair of legs of the upper core 1 and a pair of legs of the lower core 2, respectively.

As clearly shown in FIG. 2, the clamp mechanisms 4 are provided on the both sides in a direction of extension of the power line 13 (on the both of left and right sides in FIG. 2) symmetrically with respect to the induction coupling apparatus main body part 9 so that the power line 13 would be arranged under clamp arms 41 of the clamp mechanism 4.

Between the power line 13 and the induction coupling apparatus main body part 9, provided is the power line fixing tool 10, which is fixed to the induction coupling apparatus main body 9 by means of the bolt 19.

The upper core 1 and the lower core 2 are both formed from a magnetic material such as ferrite. Top end surfaces of the legs of the above cores, which face to and contact with the predetermined gap length regulating member 3, are finished with accuracy.

The predetermined gap length regulating members 3 are arranged between the both of left and right legs of the upper core 1 and the lower core 2 so as to closely adhere to the upper core 1 and the lower core 2. The predetermined gap length regulating members 3, the upper core 1 and the lower core 2 are integrated into one body to form a magnetic core 123 formed from a gap core.

A combination of the primary winding 12 for transmitting a signal, the magnetic core 123 and the power line 13 forms the induction coupling apparatus.

The predetermined gap length regulating member 3 is formed from a non-conductive material so as not to generate magnetic shielding due to eddy current since a magnetic flux passes through the predetermined gap length regulating member 3 per se in a direction of the gap length (in a vertical direction in FIGS. 1 to 3). The predetermined gap length regulating member 3 is fixed to the lower core 2 by adhesion to be mounted on the lower core 2 side as shown in the drawings in Embodiment 1.

The core case 11 holding the upper core 1 is formed from a rustproof material such as stainless steel. The core case 11 is in the shape of a container whose opening is on the lower side. The core case 11 is placed with its opening up to put the upper core inside the opening. Pouring and fixing a resin material and the like allows the upper core 1 to be fixed to the core case 11. Due to a fixed bonding material 111 such as resin, the upper core 1 is firmly fixed to the core case 11 even when the upper core 1 is provided under the core case 11 as shown in FIGS. 1 to 3.

The upper core fixing spring 5 is a leaf spring. The upper core fixing spring 5 has the function of pressing at one end thereof the upper core 1 downward in the drawings (in other words, in a direction of the gap length of the predetermined gap length regulating member 3) through the core case 11.

An end of the holding plate 14 is welded to the other end of the upper core fixing spring 5. On the other end of the holding plate 14, fixed is the nut 18, which is screwed at the top of the core driving bolt 8. The core driving bolt 8 is rotatably mounted to a first arm 91 of the induction coupling apparatus main body part 9 so as not to move in the axial direction of the rotation. The holding plate 14 and the core driving bolt 8 hold the upper core 1, the fixed bonding material 111, the core case 11 and the upper core fixing spring 5. The respective components have sufficient rigidity so as not to be deformed in the holding.

A rotation operating part 81 of the core driving bolt 8 is provided under the first arm 91. A rotating operation of the rotation operating part 81 causes the core driving bolt 8 to rotate. The holding plate 14 starts to rotate so as to follow the rotation of the core driving bolt 8 but the positioning pin 7 inserted into the schematically long hole 141 of the holding plate 14 prevents the following rotation. Accordingly, when the rotating operation of the rotation operating part 81 causes rotation of the core driving bolt 8, the nut 18 moves in the axial direction of the rotation of the core driving bolt 8 since the core driving bolt 8 does not move in the axial direction of the rotation. That is to say, rotation of the rotation operating part 81 in one direction causes the nut 18 to be raised up and rotation in the other direction causes the nut 18 to be lowered. The holding plate 14, the upper core fixing spring 5, the core case 11 and the upper core 1 are also raised up and down in accordance with the movement of rising up and down of the nut 18.

As described above, the holding plate 14 having the schematically long hole 141 and the positioning pin 7 form a positioning mechanism 147 for preventing the rotation about the bolt of the core holding mechanism part in accordance with the rotation of the core driving bolt 8 to hold the core holding mechanism part at a predetermined position.

The axial direction of the rotation of the core driving bolt 8 (in other words, a direction of extension of the core driving bolt 8) is parallel to a direction of extension of the positioning pin 7 and a gap length direction of the predetermined gap length regulating member 3. Accordingly, movement of rising up and down of the upper core 1 in accordance with the rotation of the core driving bolt 8 is parallel movement of the upper core 1 to the lower core 2.

The clamp mechanism 4 has the clamp arm 41 tapering in shape of a side surface as shown in FIG. 1. The clamp mechanism 4 is provided with a recess 42 in the shape corresponding to the external form of the power line 13 so as to be able to easily hold the power line 13 at the base of the projected thin part of the clamp arm 41. The recess 42 prevents the power line 13 from coming off when the clamp arm 41 is depressed. The clamp arm 41 is fixed to the induction coupling apparatus main body part 9 by means of the clamp bolt 16. Rotation of the clamp bolt 16 is arranged to cause the clamp arm 41 to rise up and down. The power line 13 fixing tool 10 is formed from a metal material and holds the power line 13 between the power line fixing tool 10 and the clamp arm 41.

The clamp bolt 16 is rotatably mounted to each of second and third arms 92 and 93, which are provided symmetrically on the both sides in a direction of extension of the power line 13 (on the both of left and right sides in FIG. 2) from the induction coupling apparatus main body part 9 with respect to the induction coupling apparatus main body part 9, so as not to move in the axial direction of the rotation. The clamp arm 41 is screwed into each top screw part of each clamp bolt 16.

The rotation operating parts 161 of the respective clamp bolts 16 are provided under the corresponding second and third arms 92 and 93. The respective rotation operating parts 161 and 161 are provided on the lower side, which is the same side as the rotation operating part 81 of the core driving bolt 8 and the induction coupling apparatus main body 9.

The power line fixing tools 10 are screwed to the respective mounting surfaces of the second and third arms 92 and 93 on the power line 13 side by means of the bolt 19 so as to correspond to the respective clamp arms 41 and 41.

A rotating operation of the rotation operating part 161 causes the clamp bolt 16 to rotate. When the clamp bolt 16 rotates, the clamp arm 41 also starts to rotate so as to follow the rotation of the clamp bolt 16. The power line fixing tool 10, however, prevents the rotation. Accordingly, when the rotating operation of the rotation operating part 161 causes rotation of the clamp bolt 16, the corresponding clamp arm 41 moves in the axial direction of the rotation since the clamp bolt 16 does not move in the axial direction of the rotation. That is to say, rotation of the rotation operating part 161 in one direction causes the corresponding clamp bolt 16 to rise up and rotation in the other direction causes the corresponding clamp bolt 16 to rise down.

Now, an operation of mounting the induction type signal coupling apparatus in accordance with Embodiment 1 mentioned above to the power line 13 will be described one by one.

First, the induction coupling apparatus is checked that the upper core 1 is in the upper position and the clamp arm 41 is also in the upper position as shown in FIG. 1 in Embodiment 1.

Then, a holding pole for overhead wiring (not shown) is used on the ground to hold the core driving bolt 8. The clamp arm 41 of the clamp mechanism 4 is then completely hung on the power line 13 provided at a height of several meters to move the whole apparatus so that the power line 13 would correspond to the recess 42 of the clamp arm 41.

After the power line 13 is settled in the recess 42 of the clamp arm 41 as shown in FIG. 1, the core driving bolt 8 is rotated to lower the upper core 1 in order to closely stick the upper core 1 and the lower core 2 to each other through the predetermined gap length regulating member 3, as shown in FIG. 4.

In this case, the predetermined gap length regulating member 3 is not deformed due to excessive power added to the predetermined gap length regulating member 3 since the core case 11 is fixed to the holding plate 14 through the upper core fixing spring 5 even when the core driving bolt 8 is tightly fastened, and therefore, accuracy of a gap can be maintained.

The height of the clamp 4 in the upper position, the clamp 4 holding the power line 13, is designed to be lower than the height of the inner surface of the upper core 1 completely lowered. Accordingly, an operation for closely sticking the upper core 1 and the lower core 2 is not hindered. In other words, the upper core 1, the lower core 2 and the power line 13 are arranged not to be in contact with each other when the upper core 1 and the lower core 2 closely adhere to each other via the predetermined gap length regulating member 3.

The holding pole is then removed from the core driving bolt 8 to hold and rotate one clamp bolt 16. This causes the clamp arm 41 to be depressed, and thereby, the power line 13 is fixed (that is, held) between the clamp arm 41 and the power line fixing tool 10. Following to the above, the other clamp bolt 16 in the corresponding position is also rotated similarly to the above to hold the power line 13 between the clamp arm 41 and the other power line fixing tool 10. FIG. 5 shows a condition that the clamp arm 41 is raised down to hold the power line 13 in the clamp mechanism 4.

An operation of mounting the induction coupling apparatus in Embodiment 1 to the power line 13 is completed as described above.

The induction coupling apparatus in accordance with Embodiment 1 is arranged to hold the power line 13 by means of the clamp mechanism 4 to fix the induction coupling apparatus to the power line 13, as described above. This allows the induction coupling apparatus not to be shifted in position with respect to the power line 13 even in the case of exposure to wind and rain, so that an effect that movement of the induction coupling apparatus due to wind and such does not cause a beak of a communication line occurs.

Further, the gap of the core is determined in accordance with the thickness of the predetermined gap length regulating member 3. This allows the gap to be highly accurate. Moreover, a problem is not caused such that the predetermined gap length regulating member 3 is deformed due to plasticity to cause deterioration in accuracy of the gap since the force equal to or more than the elastic force of the upper core fixing spring 5 does not add to the predetermined gap length regulating member 3 even when the core driving bolt 8 is tightly fastened in mounting the apparatus.

An inductance L in the gap core is obtained by the following formula:

$$L = \mu 0 \times S / (La/\mu' + g)$$

wherein "S" denotes a cross section, "g" denotes a gap, "$\mu 0$" denotes permeability of a vacuum, "La" denotes a length of a magnetic path of a gap core and "$\mu'$" denotes relative permeability of a core.

As clearly seen from the formula, a highly accurate gap "g" in the invention allows a value of the inductance "L" to be highly accurate. The inductance of a core is an important circuit constant in an induction coupling circuit. Accordingly, the highly accurate inductance value results in an effect that the strength of a signal, which can be transmitted in the power line, is stabilized, and thereby, the information transmission is stabilized.

Both of the core driving bolt 8 and the clamp bolt 16 are provided on the same side of the induction coupling apparatus main body part 9 at the same angle. This causes an effect that the simplicity in operation is improved such that the same operation can be carried out every time for the holding pole for overhead wiring at the same angle and that operating only one bolt enables the induction coupling apparatus to be raised to and hung on the overhead line, enables two cores to be closely stuck with each other and enables the core to be fixed.

Furthermore, using the core parallel moving mechanism 1478 for relative and parallel movement of the first core element part and the second core element part in a direction that the gap length varies allows stable and excellent induction coupling efficiency and high reliability to be secured and a low cost to be practically achieved since the core parallel moving mechanism 1478 can be formed from one holding plate 14, one core driving bolt 8 and one positioning pin 7, for example, as described above.

Moreover, the magnetic cores 1 and 2 are arranged not to be in contact with the power line 13 in a condition that the power line 13 is held in the clamp mechanism 4 on the both sides of the magnetic core in a direction of extension of the power line. This allows a collision of the power line 13 and the magnetic cores 1 and 2 due to a swing or an oscillation of an aerial power line to be avoided, so that the accuracy in coupling of the induction coupling apparatus can be improved, the accuracy in coupling can be stabilized and the reliability can be improved.

Embodiment 2

Figure 6:
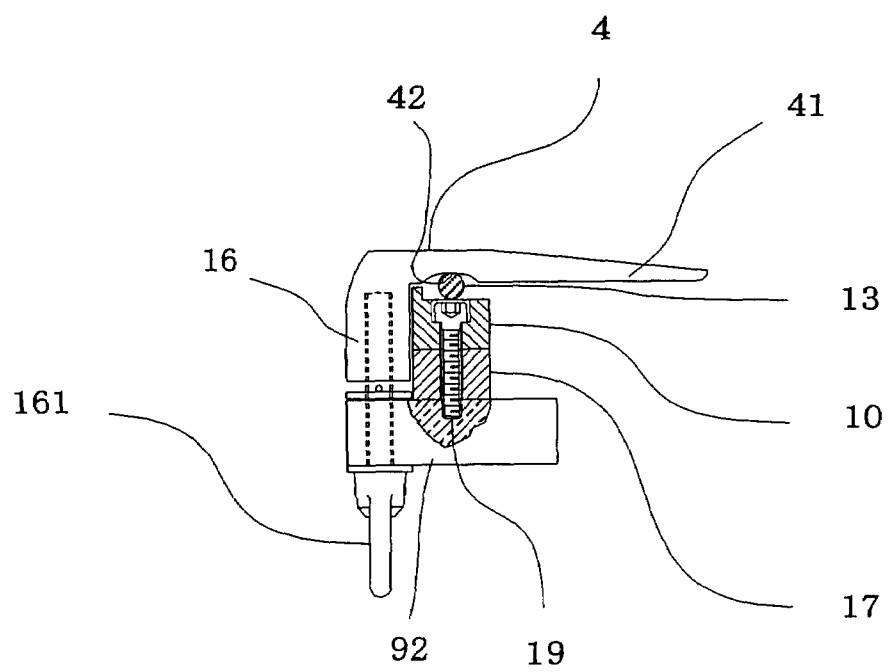
FIG. 6 is a right side view of the periphery of a clamp mechanism in accordance with Embodiment 2 of the invention in the case that a diameter of a power line is different.

A structure of an induction coupling apparatus in accordance with Embodiment 2 is substantially same as that of Embodiment 1 mentioned above. In the structure of the induction coupling apparatus in accordance with Embodiment 2, a clamp spacer 17 is provided under the power line fixing tool 10 as shown in FIG. 6.

The clamp spacer 17 is made so as to have the height corresponding to a change in diameter of the power line 13. The clamp spacer 17 is provided at the center thereof with a through hole 171 into which the fixing bolt 19 is inserted. The shape of the clamp spacer 17 can be simpler than that of the power line fixing tool 10 since only a function of adjusting the height is required.

An operation in Embodiment 2 is same as that of Embodiment 1 described above except for a point that the clamp spacer 17 is provided in advance in order to correspond to the power line 13 having a different diameter.

The above-mentioned structure of the induction coupling apparatus in accordance with Embodiment 2 allows an induction coupling apparatus for a power line having a different diameter to be provided with a slight modification made, so that an effect that a cost can be reduced is achieved.

Embodiment 3

Figure 7:
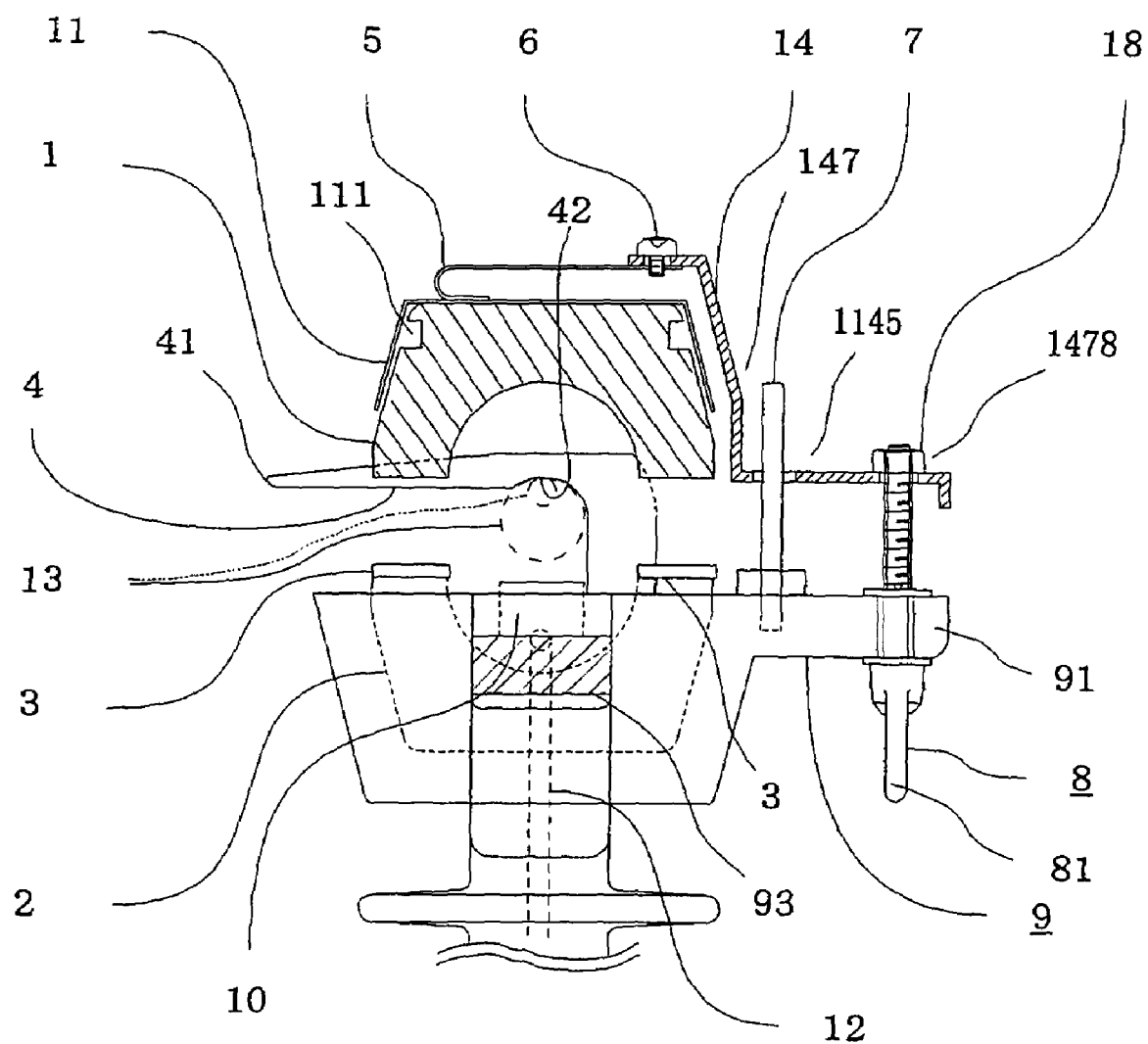
FIG. 7 is a vertically left side view corresponding to FIG. 1 of an induction coupling apparatus in accordance with Embodiment 3 of the invention.
Figure 8:
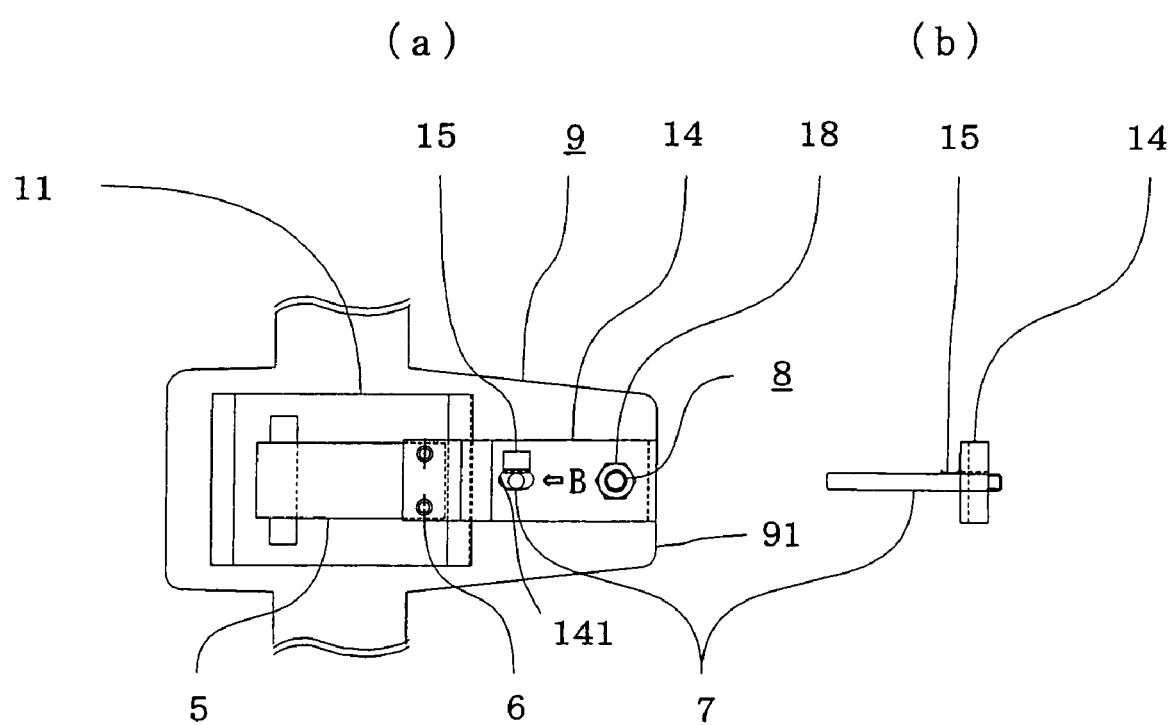
FIG. 8A is a schematically plan view of a clamp mechanism in accordance with Embodiment 3 of the invention.
FIG. 8B illustrates a relation between a positioning pin and a positioning pin fixing spring in a direction of an arrow shown in FIG. 8A.

An induction coupling apparatus in accordance with Embodiment 3 has a structure in which several structures are added to the structure of the induction coupling apparatus in accordance with Embodiment 1 described above and which is shown in FIGS. 7 and 8. In FIGS. 7 and 8, a position adjusting screw 6 is added. The upper core fixing spring 5 and the holding plate 14 are coupled by welding in Embodiment 1. In Embodiment 3, however, they are coupled by means of the position adjusting screw 6. A positioning pin fixing screw 15 is also added in FIG. 8.

The upper core fixing spring 5 is provided with a screw for the position adjusting screw 6. The holding plate 14 is provided with a through hole 142 into which the position adjusting screw 6 is inserted. The through hole 142 of the holding plate 14 has a diameter a little bit larger than the diameter of the position adjusting screw for the purpose of giving a space for adjustment by means of the position adjusting screw. The holding plate 14 having the through hole 142, the position adjusting screw 6, the upper core fixing screw 5 form a position adjusting mechanism 146 having a later-mentioned position adjusting function.

FIG. 8 shows the shape of the positioning pin fixing screw 15. The positioning pin fixing screw 15 is welded to the holding plate 14 in the vicinity of the through hole 142 for the positioning pin 7 drilled in the holding plate 14. The positioning pin fixing screw 15 allows a part in contact with the positioning pin 7 to have a curvature to fix the positioning pin 7 in one direction.

Now, described will be an operation. A process of mounting the induction coupling apparatus in accordance with the invention to the power line 13 is same as that of Embodiment 1. In Embodiment 3, however, the following adjustment is carried out before shipping the apparatus as a product in order to improve the accuracy in providing the upper core 1 and the lower core 2.

First, the upper core 1 and the lower core 2 are closely stuck to each other by means of the core driving bolt 8 under a condition that the position adjusting screw 6 is loosened. At that time, a gap material 3 is provided between the both cores. Then, fine adjustments are made to the position of the upper core 1 so that end surfaces of the upper core 1 and the lower core 2 would accurately correspond to each other. The position adjusting screw 6 is tightened after the adjustments are completed to fix the upper core fixing screw 5 and the holding body 14.

Performing such an adjustment allows the upper core 1 to be accurately positioned to the end surface of the lower core 2 even when the core driving bolt 8 is rotated to raise up and down the upper core 1. Further, the positioning pin 7 is pressed to a side surface of the through hole of the holding body 14 by means of the positioning pin fixing screw 15 in rotating the core driving bolt 8 to raise up and down the upper core 1. Accordingly, an error in providing the upper core 1 and the lower core 2 due to tolerances of diameters of the positioning pin 7 and the through hole of the holding body 14 does not occur, so that the upper core 1 and the lower core 2 are accurately positioned to each other.

As described above, it is possible to carry out the position adjustment in a relation of position between the upper core 1 and the lower core 2 after assembling the core driving bolt 8, the positioning pin 7, the holding body 14, the upper core fixing screw 5 and the core case 11. This allows the accuracy in positioning to be improved regardless of an individual variation of each component and dispersion in assembly, so that the function of an induction coupling apparatus is stabilized.

What is claimed is:

1. An induction coupling apparatus used in a system for performing signal transmission with a power line used as a medium for transmitting a signal, the induction coupling apparatus for electro-magnetically coupling a signal line used as the medium for transmitting a signal to the power line and the power line through a magnetic core, wherein
the magnetic core comprises a first holder, a first core element part carried by the first holder, a second holder, and a second core element part carried by the second holder, the first and second holders being connected together to face one another in a first direction such that a gap exists between the first and second core element parts in the first direction,
the induction coupling apparatus further comprising:
a core parallel moving mechanism extending between the first and second holders for carrying out relative and parallel movement of the first and second holders and the first and second core element parts toward and away from one another in the first direction such that the length of the gap between the first and second core element parts varies; and
a predetermined gap length regulating member for limiting parallel movement in the first direction in which the first core element part and the second core element part approach each other to regulate the gap length to the predetermined gap length in the case that the core parallel moving mechanism is used for the parallel movement.

2. The induction coupling apparatus according to claim 1, wherein
the core parallel moving mechanism includes an elastic member carried by one of the first and second holders for elastically urging a respective one of the first and second core element parts toward the other.

3. The induction coupling apparatus according to claim 2, wherein
the core parallel moving mechanism is provided with an adjusting mechanism for adjusting a relative position in a direction crossing with the direction of the parallel movement of the first core element part and the second core element part.

4. The induction coupling apparatus according to claim 3, wherein
the core parallel moving mechanism includes:
a bolt extending between the first and second holders, the bolt when rotated causing the relative and parallel movement of the first core element part and the second core element part; and
a positioning mechanism part for preventing relative rotation between the first and second holders about the bolt.

5. The induction coupling apparatus according to claim 4, wherein
the positioning mechanism includes:
a positioning pin provided in one of the holders and passing in the first direction through a through hole provided in the other holder for guiding the relative movement of the first and second core element parts in the first direction.

6. The induction coupling apparatus according to claim 5, comprising
first and second clamp mechanisms mounted to one of the first and second holders and situated on respective opposite sides of the magnetic core for holding the power line on the both sides of the magnetic core in a direction of extension of the power line, wherein
the first and second clamp mechanisms hold the power line to determine the relative position of the magnetic core and the power line.

7. The induction coupling apparatus according to claim 1, wherein
the core parallel moving mechanism is provided with an adjusting mechanism for adjusting a relative position in a direction crossing with the direction of the parallel movement of the first core element part and the second core element part.

8. The induction coupling apparatus according to claim 1, wherein
the core parallel moving mechanism includes:
a bolt extending between the first and second holders, the bolt when rotated causing the relative and parallel movement of the first core element part and the second core element part; and
a positioning mechanism part for preventing relative rotation between the first and second holders about the bolt.

9. The induction coupling apparatus according to claim 8, wherein
the positioning mechanism includes:
a positioning pin provided in one of the holders and passing in the first direction through a through hole provided in the other holder for guiding the relative movement of the first and second core element parts in the first direction.

10. The induction coupling apparatus according to claim 1, comprising first and second clamp mechanisms mounted to one of the first and second holders and situated on respective opposite sides of the magnetic core for holding the power line on the both sides of the magnetic core in a direction of extension of the power line, wherein the first and second clamp mechanisms hold the power line to determine the relative position of the magnetic core and the power line.

11. The induction coupling apparatus according to claim 10, wherein each clamp mechanism comprises:

a clamp arm movably mounted to the main body part of the induction coupling apparatus; and a positioning member mounted to the main body part of the induction coupling apparatus for determining relative positions of the magnetic core and the power line.

12. The induction coupling apparatus according to claim 11, wherein the height of the positioning member with respect to the power line is capable of adjustment.

13. The induction coupling apparatus according to claim 12, wherein the first and second clamp mechanisms are arranged to hold the power line out of contact with the magnetic core.

14. The induction coupling apparatus according to claim 10 wherein each of the first and second clamp mechanisms comprises a positioning member disposed in fixed relationship to one of the first and second core element parts as the power line is being clamped, and a clamp arm movable relative to both of the first and second core element parts toward and away from the positioning member as the power line is being clamped therebetween.

15. An induction coupling apparatus used in a system for performing signal transmission with a power line used as a medium for transmitting a signal, the induction coupling apparatus for electro-magnetically coupling a signal line used as the medium for transmitting a signal to the power line and the power line through a magnetic core, comprising a main body part;

a magnetic core mounted to the main body part; and first and second clamp mechanisms mounted to the main body part on respective opposite sides of the magnetic core for holding the power line on the both sides of the magnetic core in a direction of extension of the power line, wherein the first and second clamp mechanism holds mechanisms hold the power line to determine the relative position of the magnetic core and the power line.

16. The induction coupling apparatus according to claim 15, wherein each clamp mechanism comprises:

a clamp arm movably mounted to the main body part of the induction coupling apparatus; and a positioning member mounted to the main body part of the induction coupling apparatus for determining relative positions of the magnetic core and the power line.

17. The induction coupling apparatus according to claim 15, wherein the height of the positioning member with respect to the power line is capable of adjustment.

18. The induction coupling apparatus according to claim 15, wherein the first and second clamp mechanisms are arranged to hold the power line out of contact with the magnetic core.

19. The induction coupling apparatus according to claim 15 wherein the magnetic core comprises first and second relatively movable core element parts; each of the first and second clamp mechanisms comprising a positioning member disposed in fixed relationship to one of the first and second core element parts as the power line is being clamped, and a clamp arm movable relative to both of the first and second core element parts toward and away from the positioning member as the power line is being clamped therebetween.

* * * * *